(12) United States Patent
Kudo et al.

(10) Patent No.: US 7,450,099 B2
(45) Date of Patent: *Nov. 11, 2008

(54) DISPLAY APPARATUS AND DRIVING DEVICE FOR DISPLAYING

(75) Inventors: Yasuyuki Kudo, Kamakura (JP); Akihito Akai, Yokohama (JP); Kazuo Ookado, Kokubunji (JP); Kazunari Kurokawa, Mobara (JP); Atsuhiro Higa, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 226 days.

This patent is subject to a terminal disclaimer.

(21) Appl. No.: 10/918,379

(22) Filed: Aug. 16, 2004

(65) Prior Publication Data

US 2005/0017992 A1   Jan. 27, 2005

Related U.S. Application Data

(63) Continuation of application No. 10/161,638, filed on Jun. 5, 2002, now Pat. No. 6,781,605.

(30) Foreign Application Priority Data

Jun. 7, 2001   (JP)   ............................. 2001-171889

(51) Int. Cl.
   *G09G 3/36*   (2006.01)
(52) U.S. Cl. .......................... 345/89; 345/211; 345/212; 345/690
(58) Field of Classification Search .................... 345/87, 345/89, 211–212, 690
See application file for complete search history.

(56) References Cited

U.S. PATENT DOCUMENTS 5,745,092 A    4/1998   Ito 5,867,057 A    2/1999   Hsu et al.
5,995,073 A *  11/1999  Isami et al. ................... 345/89
6,107,981 A *  8/2000   Fujita .......................... 345/95

(Continued)

FOREIGN PATENT DOCUMENTS

EP    1 184 834    3/2002

(Continued)

OTHER PUBLICATIONS

Hitachi's New Release, May 17, 2001.

*Primary Examiner*—Richard Hjerpe
*Assistant Examiner*—Michael Pervan
(74) *Attorney, Agent, or Firm*—Antonelli, Terry, Stout & Kraus, LLP.

(57)   ABSTRACT

A display drive circuit for outputting a gray scale voltage according to display data includes a generation circuit generating gray scale voltages of a plurality of levels, and a selection circuit which selects a gray scale voltage according to the display data. When the number of colors to be displayed is small, the generation circuit decreases a current flowing into an internal circuit which generates a gray scale voltage of an intermediate level other than two gray scale voltages of a gray scale voltage of the most lowest level and a gray scale voltage of the most highest level among the gray scale voltages of the plurality of levels, and the selection circuit selects the gray scale voltage according to the display data from the most lowest level gray scale voltage and the most highest level gray scale voltage which are generated.

30 Claims, 11 Drawing Sheets

U.S. PATENT DOCUMENTS

| | | | |
|---|---|---|---|
| 6,115,014 A * | 9/2000 | Aoki et al. .................... 345/88 |
| 6,225,992 B1 | 5/2001 | Hsu et al. |
| 7,095,991 B2 | 8/2006 | Tsuchi et al. |
| 7,190,357 B2 | 3/2007 | Ohta et al. |
| 2002/0036624 A1 | 3/2002 | Ohta et al. |

FOREIGN PATENT DOCUMENTS

| | | |
|---|---|---|
| JP | 5-313612 | 11/1993 |
| JP | 6-348235 | 12/1994 |
| JP | 9-127918 | 5/1997 |
| JP | 10-142582 | 5/1998 |
| JP | 10-236084 | 12/1998 |
| JP | A-10-326084 | 12/1998 |
| JP | 2001-022325 | 1/2001 |
| JP | A-2001-345928 | 12/2001 |

* cited by examiner

FIG. 6

| LD | | M | PD | VD | |
|---|---|---|---|---|---|
| BLACK | 0 0 0 0 0 0 | | 0 0 0 0 0 0 | LOW POTENTIAL | V0 |
| | 0 0 0 0 0 1 | | 0 0 0 0 0 1 | | V1 |
| | 0 0 0 0 1 0 | | 0 0 0 0 1 0 | | V2 |
| | 0 0 0 0 1 1 | | 0 0 0 0 1 1 | | V3 |
| | 0 0 0 1 0 0 | | 0 0 0 1 0 0 | | V4 |
| | 0 0 0 1 0 1 | 0 | 0 0 0 1 0 1 | | V5 |
| | 0 0 0 1 1 0 | | 0 0 0 1 1 0 | | V6 |
| | ⋮ | | ⋮ | | ⋮ |
| | 1 1 1 1 0 1 | | 1 1 1 1 0 1 | | V61 |
| | 1 1 1 1 1 0 | | 1 1 1 1 1 0 | | V62 |
| WHITE | 1 1 1 1 1 1 | | 1 1 1 1 1 1 | HIGH POTENTIAL | V63 |
| BLACK | 0 0 0 0 0 0 | | 1 1 1 1 1 1 | HIGH POTENTIAL | V63 |
| | 0 0 0 0 0 1 | | 1 1 1 1 1 0 | | V62 |
| | 0 0 0 0 1 0 | | 1 1 1 1 0 1 | | V61 |
| | 0 0 0 0 1 1 | | 1 1 1 1 0 0 | | V60 |
| | 0 0 0 1 0 0 | | 1 1 1 0 1 1 | | V59 |
| | 0 0 0 1 0 1 | | 1 1 1 0 1 0 | | V58 |
| | 0 0 0 1 1 0 | 1 | 1 1 1 0 0 1 | | V57 |
| | ⋮ | | ⋮ | | ⋮ |
| | 1 1 1 1 0 1 | | 0 0 0 0 1 0 | | V2 |
| | 1 1 1 1 1 0 | | 0 0 0 0 0 1 | | V1 |
| WHITE | 1 1 1 1 1 1 | | 0 0 0 0 0 0 | LOW POTENTIAL | V0 |

DISPLAY APPARATUS AND DRIVING DEVICE FOR DISPLAYING

CROSS REFERENCE TO RELATED APPLICATION

This is a continuation of U.S. application Ser. No. 10/161,638, filed Jun. 5, 2002 now U.S. Pat. No. 6,781,605, the subject matter of which is incorporated by reference herein.

BACKGROUND OF THE INVENTION

The present invention relates to a display apparatus having a display panel in which display pixels are arranged in matrix and a driving device for displaying adapted to deliver the display panel gray scale voltages matching with display data and more particularly to, a display apparatus using liquid crystal, organic EL, plasma or the like and a driving device for displaying adapted for use in the same.

JP-A-6-348235 discloses a liquid crystal panel having X-signal lines and Y-signal lines, a horizontal driver for selecting, on the basis of a data signal of an image to be displayed, one gray scale signal from a plurality of gray scale signals deliver out of a gray scale voltage generating circuit and delivering the selected gray scale voltage to an X-signal line of the liquid crystal panel, and a vertical driver for delivering a scanning signal of the liquid crystal panel to a Y-signal line of the liquid crystal panel. It further discloses that the gray scale voltage generating circuit has a plurality of fixed resistors connected in series between a high-potential reference voltage and a low-potential reference voltage and voltage variable means for varying voltages at connection nodes of the fixed resistors between the high-potential and low-potential reference voltages. It further discloses that voltages at connection nodes of the fixed resistors are delivered as gray scale signals. It further discloses that the voltage variable means includes a variable resistor connected between the high-potential and low-potential reference voltages and an operational amplifier having its one input terminal connected to a voltage variable terminal of the variable resistor and its output terminal connected to a predetermined connection node of the plurality of fixed resistors.

JP-A-10-142582 discloses that a resistor ladder circuit comprised of resistors R0, R1, . . . , Rn and a resistor ladder circuit comprised of resistors R0', R1', . . . , Rn' are connected between a power supply terminal Vcc and a connection terminal GND, operational amplifiers OP1, OP2, . . . , OPn are connected between the two resistor ladder circuits, and a constant voltage generating circuit comprised of an operational amplifier OP0 is connected to a node of the resistors Rn-1' and Rn'. It further discloses that output currents of the operational amplifiers OPn and OP1 are adjusted by the resistors Rn and R1 and an output current of the operational amplifier OP0 is adjusted by the resistor Rn'.

JP-A-2001-22325 discloses a liquid crystal display apparatus having a voltage division circuit for generating a plurality of positive-negative symmetrical reference voltages from positive and negative reference voltages, a variable voltage generating circuit for supplying positive-negative symmetrical reference voltages for gray scale adjustment to one pair of positive-negative symmetrical voltage division points corresponding to a specified halftone of the voltage division circuit, and one pair of amplifiers. It further discloses a liquid crystal display apparatus having a voltage division circuit for generating a plurality of positive-negative symmetrical reference voltages from positive and negative reference voltages, a plurality of variable voltage generating circuit for supplying positive-negative symmetrical reference voltages for gray scale adjustment to a plurality of pairs of positive-negative symmetrical voltage division points corresponding to a plurality of specified halftones of the voltage division circuit, and a plurality of differential amplifiers.

But none of the above prior arts take the following problems into account.

Firstly, at the output of the gray scale voltage generating circuit, capacitive components including liquid crystal are charged/discharged simultaneously at a timing of A.C. (Alternating Current) operation. For the purpose of compensating the phase for an abrupt current change due to the charge/discharge, it is general to connect a stabilizing capacitor of 0.1 to 10 µF to the output of a voltage follower circuit. The stabilizing capacitor having a large capacitance as above needs to be provided externally of an IC even when the gray scale voltage generating circuit is implemented in an IC form, thus increasing the number of parts. Secondly, in the liquid crystal display apparatus, with the aim of preventing an image quality degradation similar to print, there needs a so-called A.C. operation for inverting, at a constant period, the polarity of a voltage applied to liquid crystal. In this phase, through a so-called asymmetric drive method for instance that makes individual levels of gradation voltages different at the positive and negative polarities, the amplitude of common voltage can be reduced and an image quality degradation such as flicker can be prevented to advantage. To realize the asymmetric drive with the gray scale voltage generating circuit, the level of reference voltage may be different for the positive and negative polarities. But, with the level of reference voltage changed periodically, the stabilizing capacitor is charged/discharged and as a result, consumption power increases.

Thirdly, in the liquid crystal display apparatus, an instance is supposed in which the number of colors possessed by input display data is smaller than the number of levels of generated gray scale voltages. In that case, unneeded gray scale voltages are generated by means of a ladder resistor, with the result that a consumptive steady current flows through the ladder resistor.

SUMMARY OF THE INVENTION

A first object of the invention is to provide a display apparatus capable of reducing the number of parts by providing a voltage follower circuit dispensing with a stabilizing capacitor and to provide its driving device for displaying.

A second object of the invention is to provide a display apparatus capable of avoiding an increase in consumption power by suppressing charge/discharge current of a stabilizing capacitor during asymmetric drive and to provide its driving device for displaying.

A third object of the invention is to provide a display apparatus capable of suppressing an increase in consumption power by eliminating a waste of steady current flowing through a ladder resistor in match with the number of display colors and to provide its driving device for displaying.

When the stabilizing capacitor is supposedly removed in the general voltage follower circuit, the most critical problem is that the phase margin decreases, giving rise to a tendency to oscillation. To obviate this problem, insertion of a resistor between the output of the voltage follower circuit and a load is effective.

Accordingly, to accomplish the first object, a voltage follower circuit according to an aspect of the invention comprises a differential amplifier, first and second buffer circuits, a resistor and two compensating capacitors, wherein outputs of the first and second buffer circuits are connected to each other through a resistor, the output of the first buffer circuit is fed back to one input of the differential amplifier and the output of the second buffer circuit serves as an output of the voltage follower circuit. By providing the resistor between the output of voltage follower circuit and a feedback point of the differential amplifier in this manner, the phase margin can be increased and output operation can be stabilized. At the same time, the output of the second buffer circuit can directly drive the load, thereby ensuring that the time constant can be decreased and the recovery time from voltage variations can be shortened.

To accomplish the second object, in a display apparatus according to another embodiment of the invention, voltage follower circuits for positive and negative polarities are provided and they are switched. With this construction, a potential applied to the stabilizing capacitor can be constant even in asymmetric drive of the stabilizing capacitor to thereby suppress the charge/discharge.

To accomplish the third object, in a display apparatus according to still another aspect of the invention, switches are provided which separate a ladder resistor at portions for generating unnecessary gray scale voltages or switch the ladder resistor to a high-resistance resistor. With this construction, steady current flowing through the ladder resistor can be optimized in match with the number of colors possessed by display data to avoid an increase in consumption power.

Other objects, features and advantages of the invention will become apparent from the following description of the embodiments of the invention taken in conjunction with the accompanying drawings.

BRIEF DESCRIPTION OF THE DRAWINGS

FIG. 6 is a diagram useful to explain operation of the drain drive circuit in the first embodiment of the invention.

DETAILED DESCRIPTION OF THE EMBODIMENTS

Figure 1:
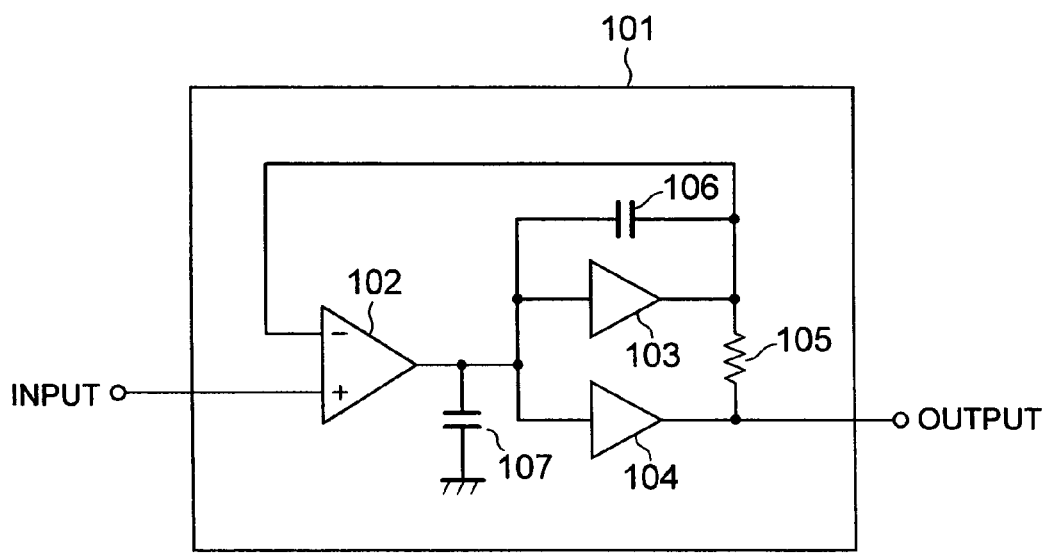
FIG. 1 is a block diagram showing the construction of a voltage follower circuit according to a first embodiment of the invention.

FIG. 1 illustrates the fundamental construction of a voltage follower circuit according to a first embodiment of the invention. The voltage follower circuit, as designated at reference numeral 101, in the present embodiment comprises a differential amplifier 102, first and second buffer circuits 103 and 104, a resistor 105 and two compensating capacitances (for example, capacitors) 106 and 107. This circuit construction is featured in that outputs of the first and second buffer circuits 103 and 104 are connected to each other through the resistor 105, with the output of first buffer circuit 103 being fed back to one input of the differential amplifier 102 and the output of the second buffer circuit 104 being connected to serve as an output of the voltage follower circuit 101. By providing the resistor 105 between the output of voltage follower circuit 101 and a node for feedback to the differential amplifier 102 in this manner, the phase margin can be increased to stabilize output operation. In addition, since the output of second buffer circuit 104 can directly drive a load, the time constant can be reduced and the recovery time from voltage variations can be shortened. In other words, the first buffer circuit 103 has a high phase margin to function to prevent oscillation. The second buffer circuit 104 has a high through rate to function to reduce the feedback time.

The differential amplifier 102 receives at the other input an input from the outside of the voltage follower circuit 101 and, at one input, the fed back input. The output of differential amplifier 102 connects to ground through the compensating capacitor 107. The first and second buffer circuits 103 and 104 receive the output of the differential amplifier 102. The compensating capacitor 106 is connected in parallel with the first buffer circuit 103. The output of the second buffer circuit 104 serves as the output of the voltage follower circuit 101. The output of first buffer circuit 103 and the output of second buffer circuit 104 routing through the resistor 105 are fed back to the differential amplifier 102.

The first embodiment of the invention will now be described with reference to FIGS. 2 to 7. The first embodiment of the invention is directed to a voltage follower circuit dispensing with the aforementioned stabilizing capacitor, the detailed circuit construction of which is exemplified in FIGS. 2 and 3.

Figure 2:
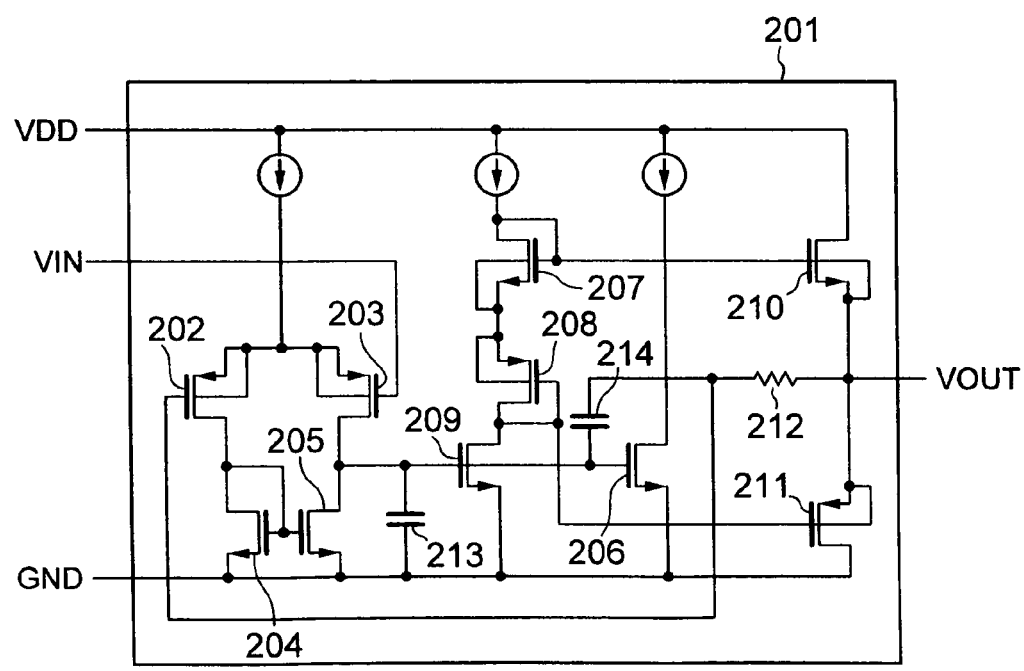
FIG. 2 is a circuit diagram showing the detailed construction of an example of the voltage follower circuit in the first embodiment of the invention.

In FIG. 2, a voltage follower circuit 201 comprises MOS transistors 202 to 211, a resistor 212 and compensating capacitances (for example, capacitors) 213 and 214. For the correspondence with components of FIG. 1, it will be appreciated that the differential amplifier 102 corresponds to a component constituted by the MOS transistors 202 to 205, the first buffer circuit 103 corresponds to a component constituted by the MOS transistor 206 and the second buffer circuit 104 corresponds to a component constituted by the MOS transistors 207 to 211.

Figure 3:
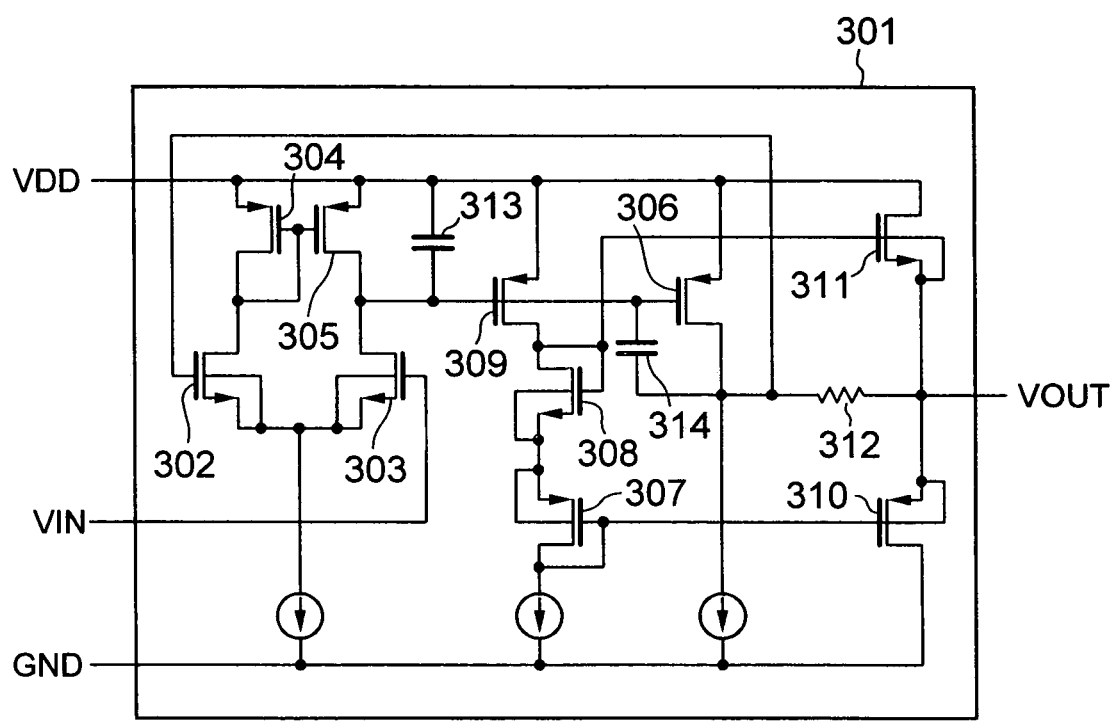
FIG. 3 is a circuit diagram showing the detailed construction of another example of the voltage follower circuit in the first embodiment of the invention.

A voltage follower circuit 301 shown in FIG. 3 differs from the voltage follower circuit 201 shown in FIG. 2 in that interchange of P channel with N channel of the MOS transistors and interchange of connection of power supply voltage are carried out.

When considering the range of available voltage level, the voltage follower circuit 201 has the output range close to ground voltage GND (low voltage) and the voltage follower circuit 301 has the output range close to power supply voltage VDV (high voltage). Accordingly, it is desirable that the two circuits be used purposively in accordance with the level of a gray scale voltage to be delivered. A voltage follower circuit with stabilizing capacitor based on a so-called class "A"

amplifier has a wider output range than that of the voltage follower circuit of the present invention. Therefore, for only a gray scale voltage at a level close to the power supply voltage VDD or ground voltage GND, the voltage follower circuit with stabilizing capacitor may be used.

An example of the circuit construction based on this idea and used for generating 64 kinds of gray scale voltages will be described.

Figure 4:
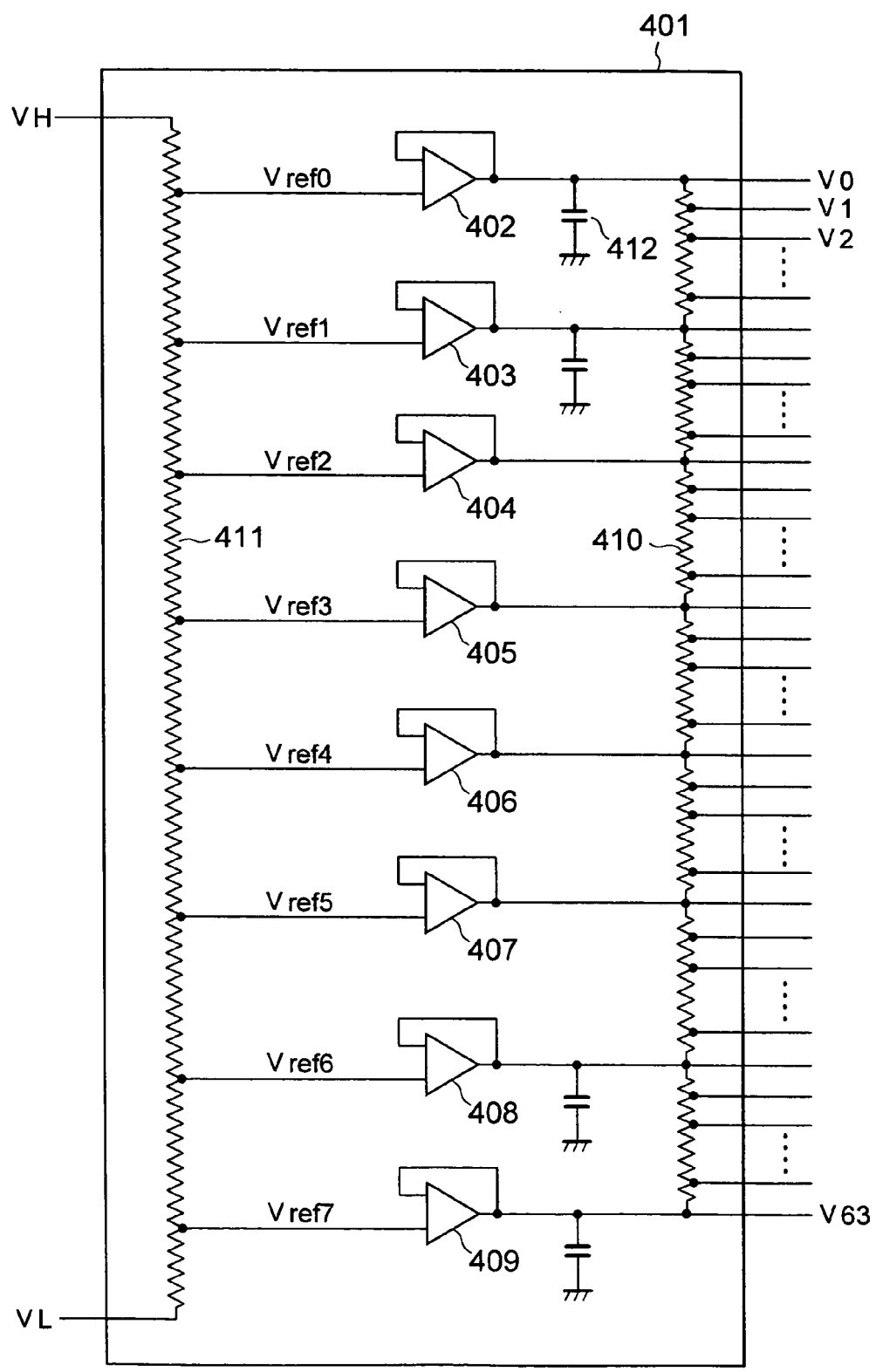
FIG. 4 is a circuit diagram showing the construction of a gray scale voltage generating circuit in the first embodiment of the invention.

FIG. 4 is a circuit diagram showing the construction of a gray scale voltage generating circuit 401. Comprises voltage follower circuits with stabilizing capacitors 402, 403 and 408, 409 based on so-called class "A" amplifiers, voltage follower circuits 404, 405 each implemented with the aforementioned voltage follower circuit 301 according to the present embodiment and voltage follower circuits 406, 407 each implemented with the aforementioned voltage follower circuit 201 also according to the present embodiment. As will be seen from FIG. 4, the voltage follower circuits 402 to 409 are arranged in such a manner that the levels of voltages delivered out of these circuits become lower in this order. More particularly, the voltage level gradually decreases from the voltage follower circuit 402 to the voltage follower circuit 409. A ladder resistor 410 divides outputs of the voltage follower circuits 402 to 409 to generate gray scale voltages V0 to V63. In the gray scale voltage generating circuit 401 of the present invention, reference voltages, generally designated at Vref, are not inputted externally but are generated by inputting a 2-level reference voltage of reference voltage VH at a high level and reference voltage VL at a low level and dividing the 2-level reference voltage by a ladder resistor 411. Advantageously, this can reduce the number of wiring lines leading to the outside. With the circuit construction described above, the gray scale voltage generating circuit 401 can generate 64 kinds of gray scale voltages. In each of the voltage follower circuits with stabilizing capacitor 402, 403, 408 and 409, the differential amplifier has its output fed back to its input. The output of the differential amplifier is connected on the other hand to ground through a stabilizing capacitance 412 (for example, capacitor).

Next, construction and operation of a drain drive circuit including the gray scale voltage generating circuit 401 will be described by taking an instance where so-called Vcom modulation drive s carried out.

Figure 5:
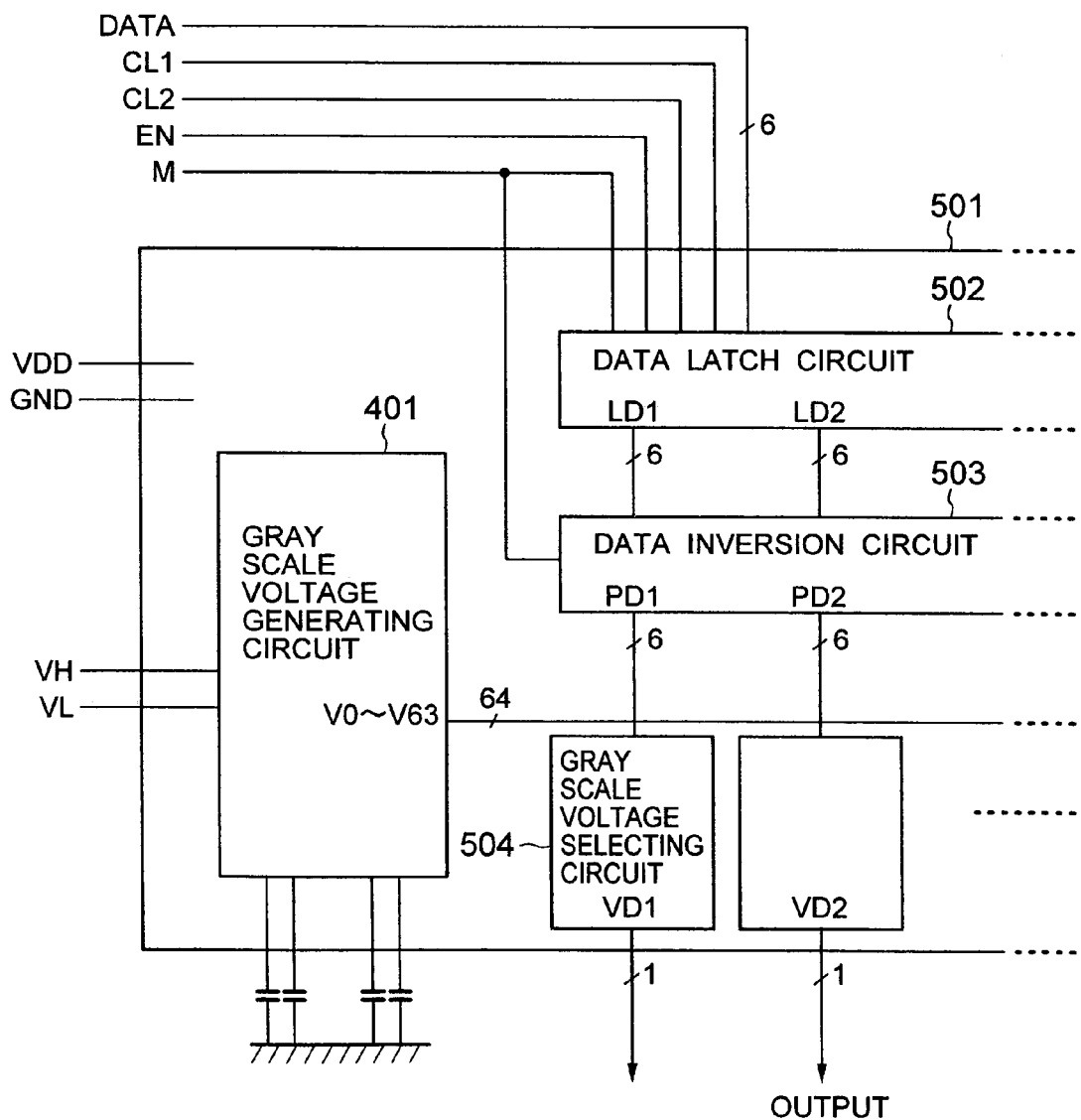
FIG. 5 is a block diagram showing the construction of a drain drive circuit in the first embodiment of the invention.

FIG. 5 is a block diagram of the drain drive circuit designated at 501. The circuit 501 comprises a data latch circuit 502 for latching display data for one line, a data inversion circuit 503 for inverting the polarity of the display data, and gray scale voltage selecting circuits 504 each adapted to select a gray scale voltage matching with the data from a plurality of gray scale voltages V0 to V63 generated by the gray scale voltage generating circuit 401. Firstly, the drain drive circuit 501 receives from an external liquid crystal controller a signal of CL1 indicative of one scanning period (one horizontal period), a signal of EN indicative of a period for transfer of effective display data, a signal of M indicative of the polarity of alternation (making it alternate), a signal of CL2 indicative of a transfer clock of the display data and a signal of DATA indicative of the display data. In the present embodiment, it is assumed that the DATA has gray scale information of plural bits (for example, 6 bits) in respect of each pixel.

FIG. 6 shows an example of operation of the drain drive circuit 501. The data latch circuit 502 repeats an operation in which it stores DATA for one line during a period of the EN being high (=1) by using the CL2 as fetching clock and delivers, as LD (line data), the stored DATA at a time in synchronism with the CL1. The data inversion circuit 503 receives inputs of the LD and M and delivers a PD while keeping the LD unchanged when the M is at low level (=0) or after inverting the LD when the M is at high level (=1). Each of the gray scale voltage selecting circuits 504 selects one gray scale voltage from the inputted gray scale voltages V0 to V63 in accordance with a value of the PD so as to deliver a VD.

Figure 7:
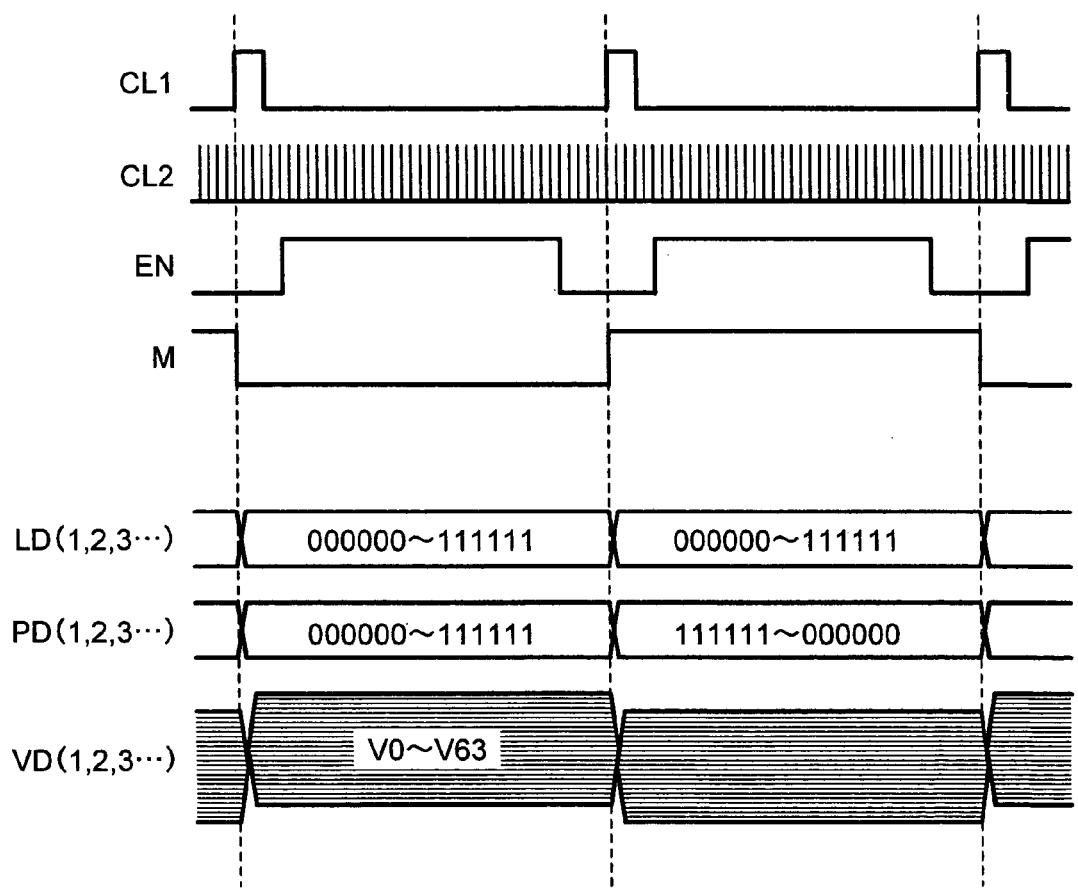
FIG. 7 is a timing chart showing operation of the drain drive circuit in the first embodiment of the invention.

FIG. 7 shows a timing chart useful to sum up the operation of the drain drive circuit 501. As will be seen from FIG. 7, voltage levels matching with the display data are delivered in accordance with the CL1, thus realizing driving waveforms of general Vcom modulation drive.

The drain drive circuit 501 described herein was made in the form of an IC and actual characteristics were measured. Firstly, as for the output range, the voltage follower circuits 404 and 405 of the invention had (VDD−0.6V) or less and the voltage follower circuit 406 and 407 of the embodiment had (GND+0.8V) or more. In addition, when a 2-inch TFT liquid crystal device of 120×160 pixels was connected to the drive circuit to carry out the Vcom modulation drive at a frame frequency of 60 Hz, all gray scale voltages can be freed from adversity such as oscillation and an excellent display can be obtained.

As will be seen from the above, the voltage follower circuits 404 to 407 of the present embodiment can provide good characteristics even without resort to the stabilizing capacitor 412 and therefore, in comparison with the conventional drain drive circuit, can reduce the number of parts of stabilizing capacitor. In the gray scale voltage generating circuit 401 in the present embodiment, the voltage follower circuits with stabilizing capacitor are used in combination but this construction is not limitative. For example, if the ranges close to the power supply voltage VDD and the ground voltage GND are not used, the circuit may be constructed of only the voltage follower circuits 201 and 301 in the present embodiment.

Next, other embodiments of the invention will be described with reference to FIGS. 8 to 10. In other embodiments, gray scale voltage generating circuits are provided which can realize suppression of charge/discharge of a stabilizing capacitor during asymmetrical drive. Like the foregoing, voltage follower circuits for positive and negative polarities are provided and they are used in switching fashion.

Figure 8:
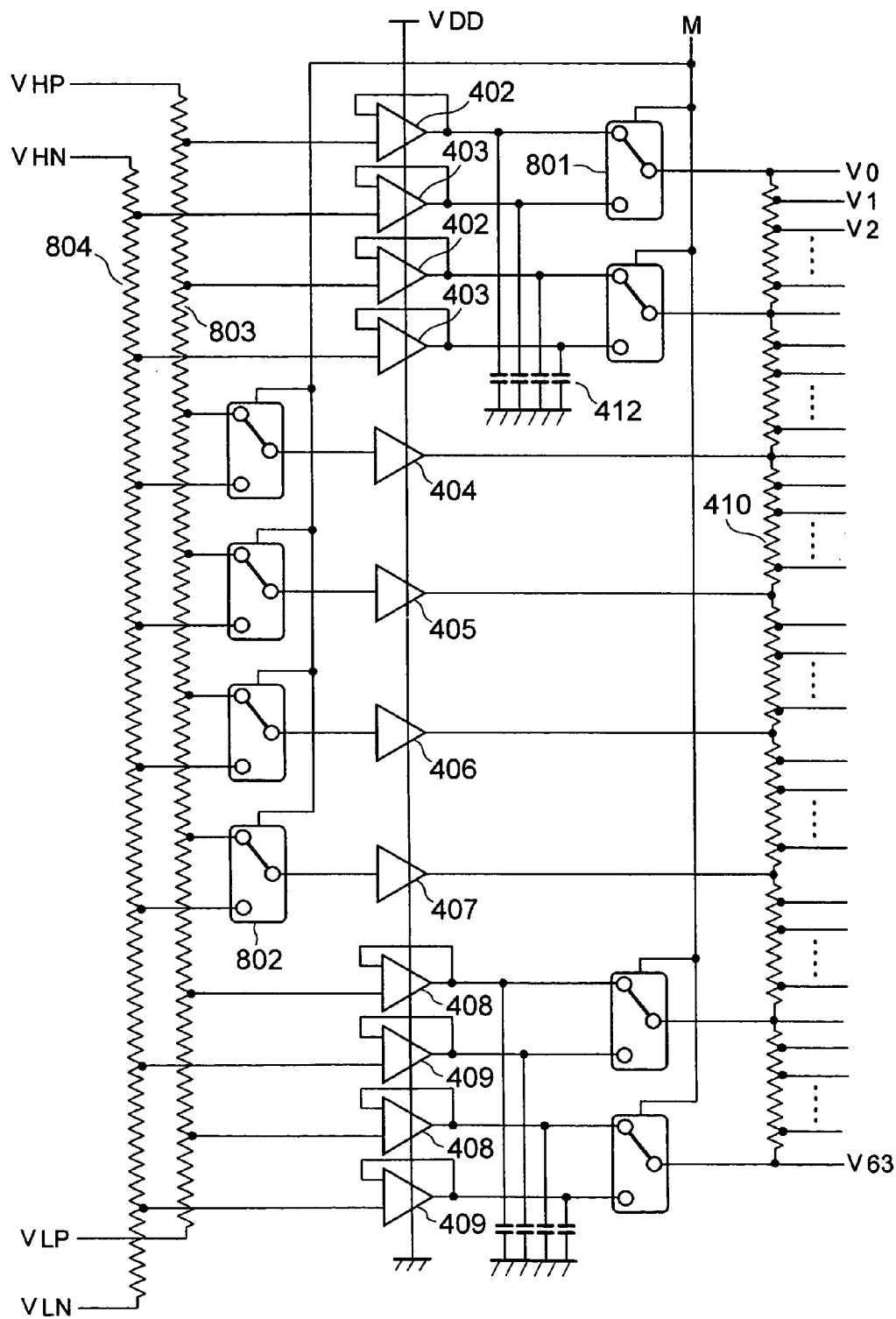
FIG. 8 is a circuit diagram showing the construction of a gray scale voltage generating circuit according to a second embodiment of the invention.

FIG. 8 illustrates a circuit diagram showing the construction of a gray scale voltage generating circuit according to a second embodiment of the invention. The circuit comprises switches for switching gray scale voltages for positive and negative polarities, a ladder resistor 803 for generating gray scale voltages for positive polarity, and a ladder resistor 804 for generating gray scale voltages for negative polarity. Other components are identical to those of the gray scale voltage generating circuit 401 shown in FIG. 4. This circuit construction is featured in that there are provided two kinds of ladder resistors 803 and 804 for positive and negative polarities and two kinds of voltage follower circuits 402 and 408 for positive polarity and voltage follower circuits 403 and 409 for negative polarity and that switches are provided which respond to an A.C. signal from the liquid crystal controller to switch the two kinds of ladder resistors and the two kinds of voltage follower circuits. In connection with the voltage follower circuits 402, 403 and 408, 409, outputs of these circuits are switched by means of the switches. The switches 801 succeed the voltage follower circuits with stabilizing capacitors 402, 403 and 408, 409 whereas the switches 802 precede voltage follower circuits without stabilizing capacitors 404 to 407 in this embodiment. For example, during a period for the A.C. signal to be low (=0), the switch 801 selects a reference voltage obtained by dividing a potential difference between reference voltages VHP and VLP by means of the ladder resistor 803 for positive polarity and during a period for the A.C. signal to be high (=1), selects a reference voltage obtained by dividing a potential difference between reference voltages VHN and VLN by means of the ladder resistor 804 for negative polarity. With this construction, the outputs of the voltage follower circuits 402, 403 and 408, 409 can be unvarying and charge/discharge of the stabilizing capacitor 412 can be avoided. On the other hand, for the voltage follower circuits 404 to 407 dispensing with stabilizing capacitor in this embodiment, the switches 802 precede amplifier inputs. This is because the number of amplifiers to be used can be decreased in comparison with the construction in which the amplifier input is followed by the switch. Like the foregoing, during a period for the A.C. signal to be low (=0), the switch 802 selects a reference voltage obtained by dividing a potential difference between reference voltages VHP and VLP by means of the ladder resistor 803 for positive polarity and during a period for the A.C. signal to be high (=1), selects a reference voltage obtained by dividing a potential difference between reference voltages VHN and VLN by means of the ladder resistor 804 for negative polarity.

Figure 9:
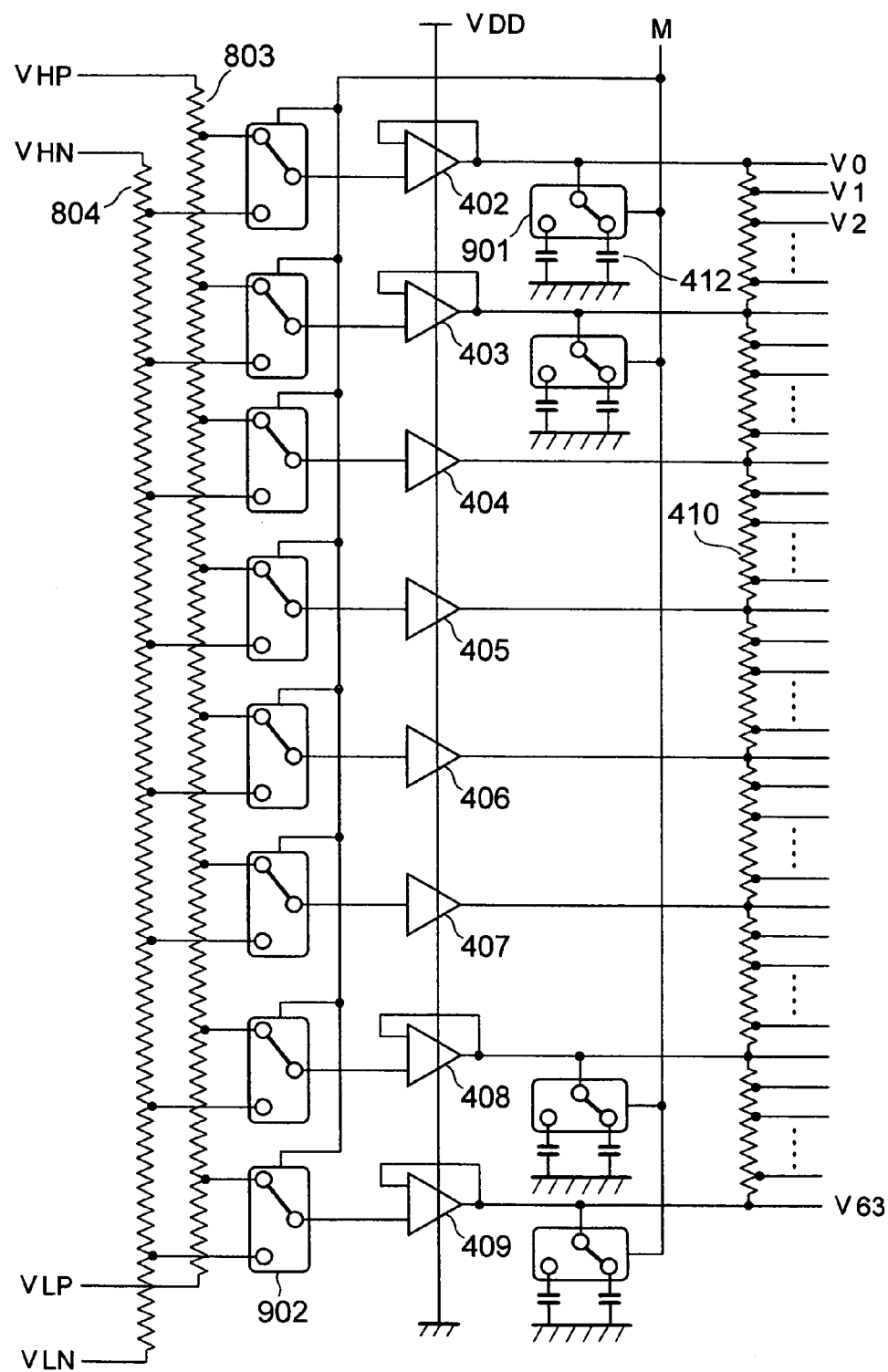
FIG. 9 is a circuit diagram showing the construction of a gray scale voltage generating circuit according to a third embodiment of the invention.

FIG. 9 illustrates a circuit diagram showing the construction of a gray scale voltage generating circuit according to a third embodiment of the invention. The circuit comprises switches 901 each adapted to selectively switch connection between a voltage follower circuit and two stabilizing capacitors 412 and switches 902 each adapted to make a choice of a reference voltage generated by a ladder resistor for positive polarity or a reference voltage generated by a ladder resistor for negative polarity. It will be seen from FIG. 9 that with this circuit construction, only the stabilizing capacitors 412 are provided for positive and negative polarities and the switch is provided which selectively switches connection of each of the voltage follower circuits 402, 403 and 408, 409 to each of the stabilizing capacitors. This construction is advantageous over the gray scale voltage generating circuit in the second embodiment shown in FIG. 8 in that the number of the voltage follower circuits 402, 403 and 408, 409 can be one for one reference voltage to reduce the circuit scale. The switches 902 precede the voltage follower circuits. The switch 901 selects one, for positive polarity, of the two stabilizing capacitors 412 during a period for the A.C. signal to be low (=0) and selects the other, for negative polarity, of the two stabilizing capacitors during a period for the A.C. signal to be high (=1).

Figure 10:
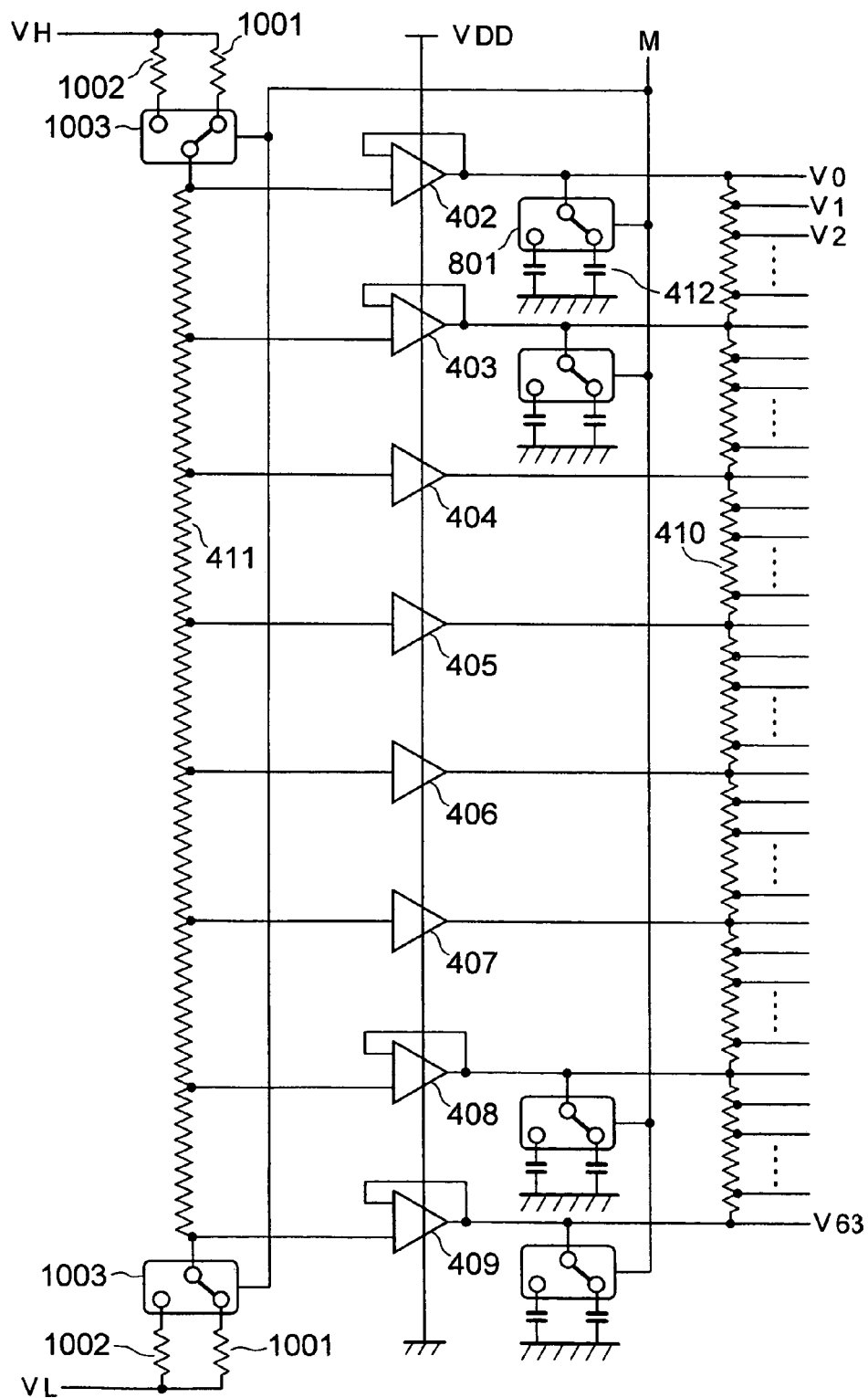
FIG. 10 is a circuit diagram showing the construction of a gray scale voltage generating circuit according to a fourth embodiment of the invention.

FIG. 10 illustrates a circuit diagram showing the construction of a gray scale voltage generating circuit according to a fourth embodiment of the invention. The circuit comprises resistors 1001 for positive polarity, resistors 1002 for negative polarity, and switches 1003 each adapted to selectively switch connection between a ladder resistor for generation of reference voltages and each of the resistors 1001 and 1002 for positive and negative polarities. The circuit construction shown in FIG. 10 intends to singularize the ladder resistor for generation of reference voltages. Specifically, any one of the ladder resistors 803 and 804 in the gray scale voltage generating circuit shown in FIG. 8 can be unneeded. Namely, by making resistance of the resistor 1001 different from that of the resistor 1002, gray scale voltages at different levels can be generated at positive and negative polarities. This construction is preferably applied to upper and lower ends of the ladder resistor so as to enhance the degree of freedom of adjustment. The switch 1003 selects the resistor 1001 for positive polarity during a period for the A.C. signal to be low (=0) and selects the resistor 1002 for negative polarity during a period for the A.C. signal to be high (=1).

In the gray scale voltage generating circuits according to the second to fourth embodiments of the invention set forth so far, even when the so-called asymmetric drive is carried out, charge/discharge of the stabilizing capacitor connected to the voltage follower circuit can be avoided. Accordingly, a drain drive circuit of more reduced consumption power can be provided.

Figure 11:
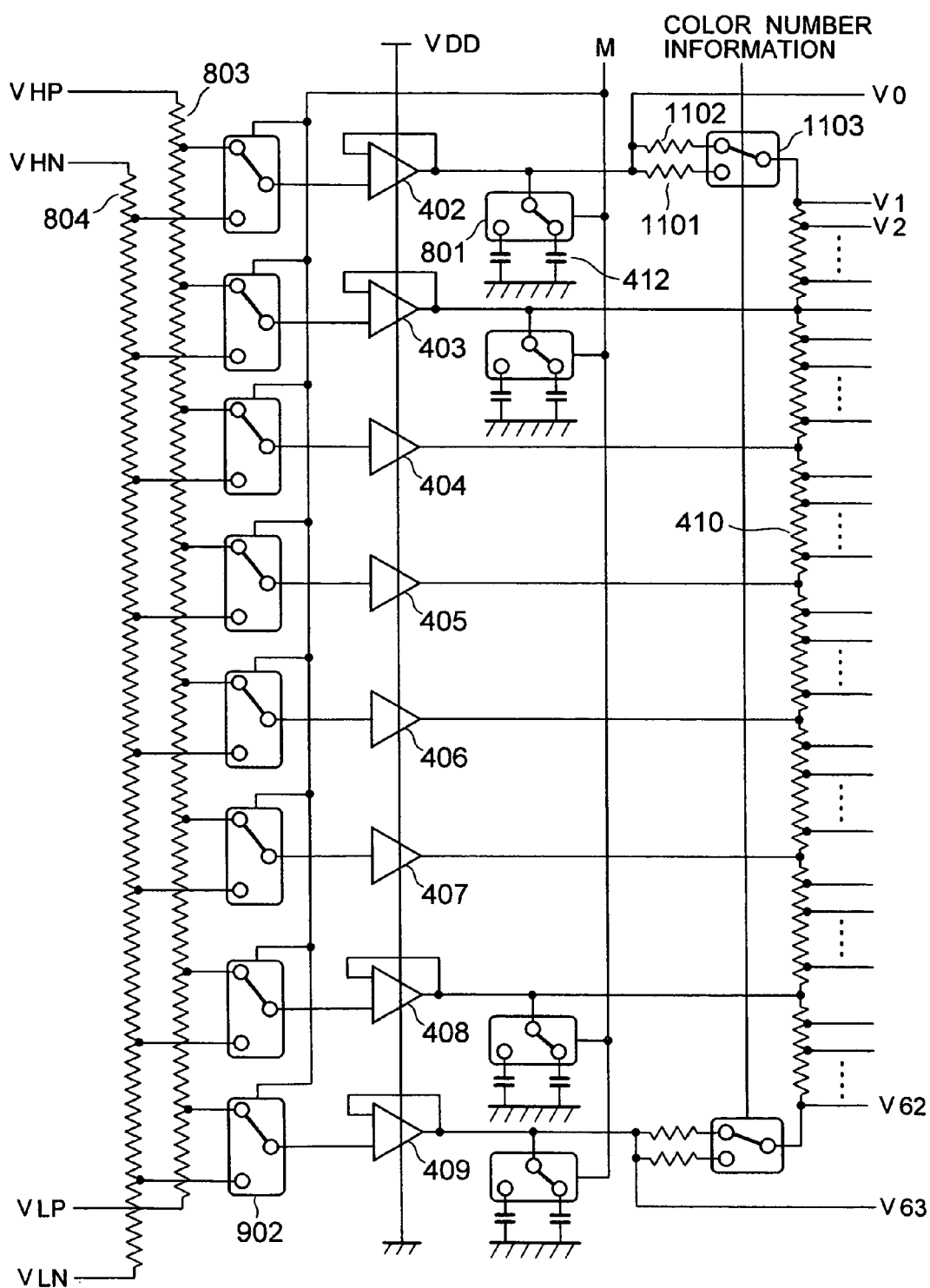
FIG. 11 is a circuit diagram showing the construction of a gray scale voltage generating circuit according to a fifth embodiment of the invention.

FIG. 11 illustrates a circuit diagram showing the construction of a gray scale voltage generating circuit according to a fifth embodiment of the invention. In the fifth embodiment of the invention, a method is disclosed which can optimize steady current flowing through a ladder resistor in match with the number of colors possessed by display data with the aim of eliminating any consumptive steady current flowing the through the ladder resistor. In the fifth embodiment, color number information possessed by display data is of multiple bits (for example, plural bits amounting to 6 bits) or is of minor bits (for example, a single bit amounting to one bit) and it is assumed that either state is determined by information supplied from the external liquid crystal controller. It is also assumed that when the color number information possessed by the display data is of 6 bits, all of 64 kinds of gray scale voltages (V0 to V63) are used and in case of one bit, only gray scale voltages at opposite ends (V0 and V63) are used.

The circuit of FIG. 11 comprises resistors 1101 for 6 bits, resistors 1102 for one bit, and switches 1103 each adapted to switch connection to the resistor 1101 for 6 bits and connection to the resistor 1102 for one bit in accordance with the color number information. For example, when the color number information is high (=1), the switch 1103 recognizes a 6-bit display mode to select the resistor 1101 for 6 bits and when the color number information is low (=0), it recognizes a one-bit display mode to select the resistor 1102 for one bit. Here, the resistance of the one-bit display resistor 1102 is so determined in advance as to be sufficiently larger than that of the 6-bit resistor 1101 in order that when the resistor 1102 is selected, the current flowing through the ladder resistor can be reduced. This takes advantage of the fact that in the display mode of the color number being one bit, only the gray scale voltages at opposite ends (V0 and V63) are used as described previously and consequently, even if the levels of other gray scale voltages vary, this variation does not affect display. In case the display data is of minor bits, the number of gray scales of the display data is small but in case the display data is of multiple bits, the number of gray scales of the display data is large. In place of the resistor 1101 for 6 bits, resistor 1102 for one bit and switch 1103, a variable resistor can be used and in place of the switch 1103, a variable resistor control circuit can be used. For example, if the color number information is high (=1), the variable resistor control circuit recognizes the 6-bit display mode to decrease the resistance of the variable resistor and if the color number information is low (=0), it recognizes the one-bit display mode to increase the resistance of the variable resistor.

As described above, the gray scale voltage generating circuit according to the fifth embodiment of the invention can control the value of current flowing through the ladder resistor for generation of gray scale voltages in accordance with the color number information. Accordingly, a drain drive circuit of more reduced consumption power can be provided. In the fifth embodiment of the invention, two kinds of resistors for 6 bits and one bit are provided but this is not limitative and for example, in the one-bit display mode, V0 and V63 can be completely disconnected from the ladder resistor.

Thus, in an application of the gray scale voltage generating circuit according to the fifth embodiment of the invention to a handy phone or an information processing apparatus requiring low power such as PDA, when the information processing apparatus is in waiting condition, the MPU of the information processing apparatus may command information purporting that the number of colors is small to the gray scale voltage generating circuit and when the information processing apparatus is in call condition (during communication), the MPU of the information processing apparatus may command information purporting that the number of colors is large to the gray scale voltage generating circuit. In other words, the information processing apparatus gives a display of multiple gray scale when the user makes use of it but gives a display of minor gray scale when the user does not make use of it. Through this, power consumption in the gray scale voltage generating circuit can be reduced when the user does not make use of it, thus reducing power consumption in the information processing apparatus.

Figure 12:
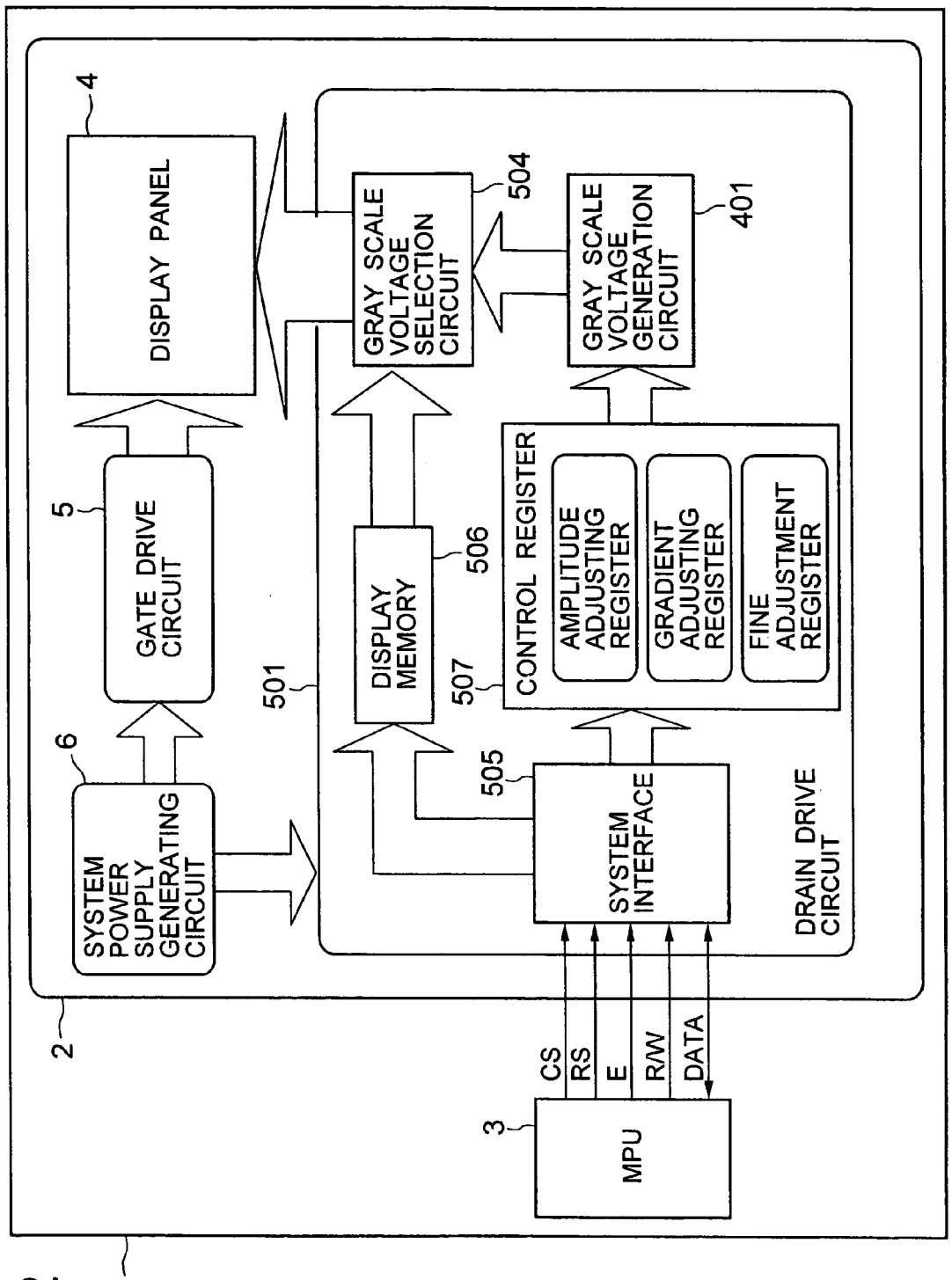
FIG. 12 is a block diagram of an information processing apparatus provided with the gray scale voltage generating circuit according to the invention.

FIG. 12 illustrates a block diagram of an information processing apparatus provided with the gray scale voltage generating circuit according to the invention. The information processing apparatus, as generally designated at reference numeral 1, comprises a display apparatus 2 for displaying display data and a MPU 3 for performing operation processing. The display apparatus 2 includes a display panel 4 having display pixels arranged in matrix, a drain drive circuit 501 for generating gray scale voltages corresponding to the display data and applying the gray scale voltages to the display panel 4, a gate drive circuit 5 for selecting a line of pixels to be applied with the gray scale voltages, and a system power supply generating circuit 6 for generating operating power supply for the drain drive circuit 501 and gate drive circuit 5. The system power supply generating circuit 6 generates reference voltages VH, VL, VHP, VLH, VHN and VLN and a power supply voltage VDD for the drain drive circuit 501. The drain drive circuit 501 includes a gray scale voltage generating circuit 401 for generating a plurality of gray scale voltages V0 to V63, a gray scale voltage selecting circuit 504 for selecting one gray scale voltage matched with the display data from the plurality of gray scale voltages V0 to V63, a system interface 505 for receiving the display data and control signals from the MPU 3, a display memory 506 (for example, RAM) for temporarily storing one frame of the display data, and a control register 507 for setting gray scale voltage characteristics matching with characteristics of the display panel 4. The control register 507 includes a register for adjusting the amplitude, a register for adjusting the gradient and a register for performing fine adjustment, in the relation between gray scale number and gray scale voltage.

The first to fifth embodiments of the invention have been described by way of example of the Vcom modulation drive but this is not limitative and the invention may also be applied, on the basis of a similar idea, to dot inversion drive and column inversion drive known as other drive methods.

Advantageously, the drain drive circuit according to the invention can reduce the number of external stabilizing capacitors used or dispense with the external stabilizing capacitor to thereby attain cost reduction. Further, even when external stabilizing capacitors are provided, the circuit can be so constructed as to prevent the stabilizing capacitor per se from being charged/discharged and consequently, consumption power can be reduced. Further, the necessary steady current can be controlled in match with the number of colors possessed by input display data, thereby making it possible to further reduce consumption power.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A display drive circuit for outputting a gray scale voltage according to display data to a display panel, comprising:
a generation circuit which generates gray scale voltages of a plurality of levels; and
a selection circuit which selects said gray scale voltage according to said display data, among gray scale voltages having said plurality of levels;
said display drive circuit having a mode in which the number of colors to be displayed on said display panel is small, and an other mode in which the number of colors to be displayed on said display panel is large;
wherein said generation circuit, in the mode in which the number of colors to be displayed on a display panel is small, decreases a current flowing into an internal circuit which generates a gray scale voltage of an intermediate level other than two gray scale voltages of a gray scale voltage of the most lowest level and a gray scale voltage of the most highest level among the gray scale voltages of said plurality of levels, in comparison to a current flowing in the other mode; and
wherein said selection circuit, in the mode in which the number of colors to be displayed on said display panel is small, selects said gray scale voltage according to said display data, from the two gray scale voltages of said most lowest level gray scale voltage and said most highest level gray scale voltage which are generated from said generation circuit.

2. A display drive circuit according to claim 1, further comprising:
a switching circuit which switches a resistance of a resistor for dividing between said lowest level gray scale voltage and said intermediate level gray scale voltage and a resistance of a resistor for dividing between said highest level gray scale voltage and said intermediate level gray scale voltage with each other;
wherein said switching circuit, in the mode in which the number of colors to be displayed on said display panel is small, increases the resistance of said resistor for dividing between said lowest level gray scale voltage and said intermediate level gray scale voltage and the resistance of said resistor for dividing between said highest level gray scale voltage and said intermediate level gray scale voltage.

3. A display drive circuit according to claim 2, wherein said resistor for dividing between said lowest level gray scale voltage and said intermediate level gray scale voltage further includes a resistor of a high resistance and another resistor of a low resistance connected in parallel with each other;
wherein said resistor for dividing between said highest level gray scale voltage and said intermediate level gray scale voltage further includes a resistor of a high resistance and another resistor of a low resistance connected in parallel with each other; and
wherein said switching circuit, in the mode in which the number of colors to be displayed on said display panel is small, selects a resistor of the high resistance resistor among the resistors for dividing between said lowest level gray scale voltage and said intermediate level gray scale voltage, and selects a resistor of the high resistance among the resistors for dividing between said highest level gray scale voltage and said intermediate level gray scale voltage.

4. A display drive circuit according to claim 2, wherein said resistor for dividing between said lowest level gray scale voltage and said intermediate level gray scale voltage end said resistor for dividing between said highest level gray scale voltage and said intermediate level grey scale voltage both are variable resistors; and wherein said switching circuit, in the mode in which the number of colors to be displayed on said display panel is small, increases the resistance of the variable resistor for dividing between said lowest gray scale voltage and said intermediate level grey scale voltage and the resistance of the variable resistor for dividing between said highest level gray scale voltage and said intermediate gray scale voltage.

5. A display drive circuit according to claim 1, wherein said generation circuit decreases the current flowing into said internal circuit using a resistor.

6. A display drive circuit according to claim 5, wherein said generation circuit decreases the current flowing into said internal circuit by switching the resistance of the resistor according to either of said modes.

7. A display drive circuit according to claim 1, wherein said selection circuit, in the mode in which the number of colors to be displayed on said display panel is large, selects said gray scale voltage according said display data, from gray scale voltages of a plurality of levels including said most lowest level gray scale voltage, said most highest level gray scale voltage and said intermediate level gray scale voltage which are generated from said generation circuit; and said display drive circuit includes a circuit for switching the current flowing into said internal circuit according to said mode.

8. A display drive circuit according to claim 1, wherein said internal circuit includes a dividing circuit; and said dividing circuit generates gray scale voltages of a plurality of levels including most highest level gray scale voltage, the most lowest level gray scale voltage, said intermediate level gray scale voltage by dividing a reference voltage.

9. A display drive circuit according to claim 8, wherein said dividing circuit is formed of resistors.

10. A display drive circuit according to claim 1, wherein information representing either of said modes is inputted from an external device of said display drive circuit.

11. A display drive circuit according to claim 1, further comprising:

a slant adjusting register for adjusting a gradient of a gray scale voltage characteristic;

an amplitude adjusting register for adjusting an amplitude of said gray scale voltage characteristic; and a fine adjusting register for fine-adjusting said gray scale voltage characteristic.

12. A display drive circuit for outputting a gray scale voltage according to display data to a display panel, comprising:

a generation circuit which generates gray scale voltages of 64 levels from 0-th level to 63-th level; and a selection circuit which selects said gray scale voltage according to said display data, among grey scale voltages having said 64 levels;

said display drive circuit having a mode in which the number of colors to be displayed on said display panel is small and another mode in which the number of colors to be displayed on said display panel is large;

wherein said generation circuit, in the mode in which the number of colors to be displayed on a display panel is small, decreases a current flowing into an internal circuit which generates a gray scale voltage from the first level to 62-th level other than two gray scale voltages of a gray scale voltage of the 0-th level and a gray scale voltage of the 63-th level among the gray scale voltages of said 64 levels; and wherein said selection circuit, in the mode in which the number of colors to be displayed on said display panel is small, selects said gray scale voltage according to said display data, from the two gray scale voltages of said 0-th level gray scale voltage and said 63-th level gray scale voltage which are generated from said generation circuit.

13. A display drive circuit according to claim 12, comprising:

a gradient adjusting register for adjusting a gradient of a gray scale voltage characteristic;

an amplitude adjusting register for adjusting an amplitude of said gray scale voltage characteristic; and a fine adjusting register for fine-adjusting said gray scale voltage characteristic.

14. A display drive circuit for outputting a gray scale voltage according to display data to a display panel, comprising:

a generation circuit which generates gray scale voltages of a plurality of levels; and a selection circuit which selects said gray scale voltage according to said display data, among gray scale voltages having said plurality of levels;

said display drive circuit having a mode in which the number of colors to be displayed on said display panel is small, and an other mode in which the number of colors to be displayed on said display panel is large;

wherein said generation circuit, in the mode in which the number of colors to be displayed on the display panel is small, decreases a current flowing into an internal circuit which generates a gray scale voltage of an intermediate level other than two gray scale voltages of a gray scale voltage of the most lowest level and a gray scale voltage of the most highest level among the gray scale voltages of said plurality of levels, in comparison to a current flowing in the other mode;

wherein said selection circuit, in the mode in which the number of colors to be displayed on said display panel is small, selects said gray scale voltage according to said display data, from the two gray scale voltages of said most lowest level gray scale voltage and said most highest level gray scale voltage which are generated from said generation circuit;

wherein an external MPU (microprocessor unit) judges whether or not said number of colors to be displayed on the display panel is small; and wherein said display drive circuit receives information representing either of said modes, from said external MPU.

15. A display drive circuit according to claim 14, comprising:

a gradient adjusting register for adjusting a gradient of a gray scale voltage characteristic;

an amplitude adjusting register for adjusting an amplitude of said gray scale voltage characteristic; and a fine adjusting register for fine-adjusting said gray scale voltage characteristic.

16. A display drive circuit for outputting a grey scale voltage according to display data to a display panel, comprising:

a system interface for inputting said data externally;

a memory for storing said display data;

a generation circuit which generates gray scale voltages of plurality of levels by dividing a reference voltage into a plurality of levels using a resistor;

a selection circuit which selects said gray scale voltage according to said display data from said memory, among gray scale voltages having said plurality of levels;

a gradient adjusting register for adjusting a gradient of a gray scale voltage characteristic;

an amplitude adjusting register for adjusting an amplitude of said gray scale voltage characteristic; and a fine adjusting register for a fine-adjusting said gray scale voltage characteristic;

said display drive circuit having a mode in which the number of colors to be displayed on said display panel is small, and an other mode in which the number of colors to be displayed on said display panel is large;

wherein said generation circuit, in the mode in which the number of colors to be displayed on a display panel is small, decreases a current flowing into an internal circuit which generates a gray scale voltage of a level other than two gray scale voltages of a gray scale voltage of a first level and a gray scale voltage of a second level among the gray scale voltages of said plurality of levels, in comparison to a current flowing in the other mode; and wherein said selection circuit, in the mode in which the number of colors to be displayed on said display panel is small, selects said gray scale voltage according to said display data, from the two gray scale voltages of said first level gray scale voltage and said second level gray scale voltage which are generated from said generation circuit.

17. A display drive circuit for outputting a gray scale voltage according to display data to a display panel, comprising:

a generation circuit which generates gray scale voltages of a plurality of levels; and a selection circuit which selects said gray scale voltage according to said display data, among gray scale voltages having said plurality of levels;

said display drive circuit having a mode in which the number of colors to be displayed on said display panel is small, and an other mode in which the number of colors to be displayed on said display panel is large;

wherein said generation circuit, in the mode in which the number of colors to be displayed on a display panel is small, disconnects an internal circuit which generates a gray scale voltage of an intermediate level other than two gray scale voltages of a gray scale voltage of the most lowest level and a gray scale voltage of the most highest level among the gray scale voltages of said plurality of levels in comparison to a connected internal circuit in the other mode; and wherein said selection circuit, in the mode in which the number of colors to be displayed on said display panel is small, selects said gray scale voltage according to said display data, from the two gray scale voltages of said most lowest level of said gray scale voltage and said most highest level gray scale voltage which are generated from said generation circuit.

18. A display drive circuit according to claim 17, further comprising:

a switching circuit which switches a resistance of a resistor for dividing between said lowest level gray scale voltage and said intermediate level gray scale voltage and a resistance of a resistor for dividing between said highest level gray scale voltage and said intermediate level gray scale voltage with each other;

wherein said switching circuit, in the mode in which the number of colors to be displayed on said display panel is small, increases the resistance of said resistor for dividing between said lowest level gray scale voltage and said intermediate level grey scale voltage and the resistance of said resistor for dividing between said highest level gray scale voltage and said intermediate level gray scale voltage.

19. A display drive circuit according to claim 18, wherein said resistor for dividing between said lowest level gray scale voltage and said intermediate level gray scale voltage further includes a resistor of a high resistance and another resistor of a low resistance connected in parallel with each other;

wherein said resistor for dividing between said highest level grey scale voltage and said intermediate level gray scale voltage further includes a resistor of a high resistance and another resistor of a low resistance connected in parallel with each other; and wherein a switching circuit, in the mode in which the number of colors to be displayed on said display panel is small, selects a resistor of the high resistance resistor among the resistors for dividing between said lowest level gray scale voltage and said intermediate level gray scale voltage, and selects a resistor of the high resistance among the resistors for dividing between said highest level gray scale voltage and said intermediate level gray scale voltage.

20. A display drive circuit according to claim 19, wherein said resistor for dividing between said lowest level gray scale voltage and said intermediate level gray scale voltage and said resistor for dividing between said highest lever gray scale voltage and said intermediate level gray scale voltage both are variable resistors; and wherein a switching circuit, in the mode in which the number of colors to be displayed on said display panel is small, increases the resistance of variable resistor for dividing between said lowest level gray scale voltage and said intermediate level gray scale voltage and the resistance of variable resistor for dividing between said highest level gray scale voltage and said intermediate level gray scale voltage.

21. A display drive circuit according to claim 1, wherein said selection circuit, in the mode in which the number of colors to be displayed on said display panel is large, selects said gray scale voltage according to said display data, from gray scale voltages of a plurality of levels including said most lowest level gray scale voltage, said most highest level gray scale voltage and said intermediate level gray scale voltage which are generated from said generation circuit; and said display drive circuit includes a circuit for switching the current flowing into said internal circuit according to said mode.

22. A display drive circuit according to claim 1, wherein said internal circuit includes a dividing circuit; and said dividing circuit generates gray scale voltages of a plurality of levels including the most highest level gray scale voltage, the most lowest level gray scale voltage and said intermediate level gray scale voltage by dividing a reference voltage.

23. A display drive circuit according to claim 22, wherein said dividing circuit is formed of resistors.

24. A display drive circuit according to claim 1, wherein information representing either of said modes is inputted from an external device of said display drive circuit.

25. A display drive circuit according to claim 17, comprising:

a slant adjusting register for adjusting a gradient of a gray scale voltage characteristic;

an amplitude adjusting register for adjusting an amplitude of said gray scale voltage characteristic; and a fine adjusting register for fine-adjusting said gray scale voltage characteristic.

26. A display drive circuit for outputting a gray scale voltage according to display data to a display panel, comprising:
a generation circuit which generates gray scale voltages of 64 levels from 0-th level to 63-th level; and
a selection circuit which selects said gray scale voltage according to said display data, among gray scale voltages having 64 levels;
said display drive circuit having a mode in which the number of colors to be displayed on said display panel is small, and an other mode in which the number of colors to be displayed on said display panel is large;
wherein said generation circuit in the mode in which the number of colors to be displayed on a display panel is small, disconnects an internal circuit which generates a gray scale voltage of from the first level to 62-th level other than two gray scale voltages of a gray scale voltage of the 0-th level and a gray scale voltage of the 63-th level among the gray scale voltages of said 64 levels, in comparison to a connected internal circuit in the other mode; and
wherein said selection circuit, in the mode in which the number of colors to be displayed on said display panel is small, selects said gray scale voltage according to said display data, from the two gray scale voltages of said 0-th level gray scale voltage and said 63-th level gray scale voltage which are generated from said generation circuit.

27. A display drive circuit according to claim 26, comprising:
a gradient adjusting register for adjusting a gradient of a gray scale voltage characteristic;
an amplitude adjusting register for adjusting an amplitude of said gray scale voltage characteristic; and
a fine adjusting register for fine-adjusting said gray scale voltage characteristic.

28. A display drive circuit for outputting a gray scale voltage according to display data to a display panel, comprising:
a generation circuit which generates gray scale voltages of a plurality of levels; and
a selection circuit which selects said gray scale voltage according to said data display, among gray scale voltages having said plurality of levels;
said display drive circuit having a mode in which the number of colors to be displayed on said display panel is small and an other mode in which the number of colors to be displayed on said display panel is large;
wherein said generation circuit, in the mode in which the number of colors to be displayed on a display panel is small, disconnects an internal circuit which generates a gray scale voltage of an intermediate level other than two grayscale voltages of a gray scale voltage of the most lowest level and a gray scale voltage of the highest level among the gray scale voltages of said plurality of levels, in comparison to a connected internal circuit in the other mode;

wherein said selection circuit, in the mode in which the number of colors to be displayed on said display panel is small, selects said grey scale voltage according to said display data, from the two gray scale voltage of said most lowest level grey scale voltage and said most highest level grey scale voltage which are generated from said generation circuit;
wherein an external MPU (microprocessor unit) judges whether or not said number of colors to be displayed on the display panel is small; and
wherein said display drive circuit receives information representing either of said modes, from said external MPU.

29. A display drive circuit according to claim 28, comprising:
a gradient adjusting register for adjusting a gradient of a gray scale voltage characteristic;
an amplitude adjusting register for adjusting an amplitude of said gray scale voltage characteristic; and
a fine adjusting register for fine-adjusting said gray scale voltage characteristic.

30. A display drive circuit for outputting a gray scale voltage according to display data to a display panel, comprising:
a system interface for inputting said display data externally;
a memory for storing said display data;
a generation circuit which generates gray scale voltages of a plurality of levels by dividing a reference voltage into a plurality of levels using a resistor;
a selection circuit which selects said gray scale voltage according to said display data from said memory, among gray scale voltages having said plurality of levels;
a gradient adjusting register for adjusting a gradient of a gray scale voltage characteristic;
an amplitude adjusting register for adjusting an amplitude of said gray scale voltage characteristic; and
a fine adjusting register for fine-adjusting said gray scale voltage characteristic;
said display drive circuit having a mode in which the number of colors to be displayed on said display panel is small, and an other mode in which the number of colors to be displayed on said display panel is large;
wherein said generation circuit, in the mode in which the number of colors to be displayed on a display panel is small, disconnects an internal circuit which generates a gray scale voltage of a level other than two gray scale voltages of a gray scale voltage of a first level and a gray scale voltage of a second level among the gray scale voltages of said plurality of levels, in comparison to a connected internal circuit in the other mode; and
wherein said selection circuit, in the mode in which the number of colors to be displayed on said display panel is small, selects said gray scale voltage according to said display data, from the two gray scale voltages of said first level gray scale voltage and said second level gray scale voltage which are generated from said generation circuit.

* * * * *